United States Patent
Li et al.

(10) Patent No.: US 10,566,313 B1
(45) Date of Patent: Feb. 18, 2020

(54) INTEGRATED CIRCUIT CHIP CARRIER WITH IN-PLANE THERMAL CONDUCTANCE LAYER

(71) Applicant: International Business Machines Corporation, Armonk, NY (US)

(72) Inventors: Shidong Li, Poughkeepsie, NY (US); Kamal K. Sikka, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/106,577

(22) Filed: Aug. 21, 2018

(51) Int. Cl.
| | | |
|---|---|---|
| *H01L 25/065* | (2006.01) | |
| *H01L 23/367* | (2006.01) | |
| *H01L 21/56* | (2006.01) | |
| *H01L 23/00* | (2006.01) | |
| *H01L 23/373* | (2006.01) | |
| *H01L 23/34* | (2006.01) | |
| *H01L 23/42* | (2006.01) | |
| *H01L 23/552* | (2006.01) | |
| *H01L 23/36* | (2006.01) | |

(52) U.S. Cl.
CPC ........ *H01L 25/0657* (2013.01); *H01L 21/563* (2013.01); *H01L 23/3677* (2013.01); *H01L 23/3735* (2013.01); *H01L 24/48* (2013.01); *H01L 23/34* (2013.01); *H01L 23/36* (2013.01); *H01L 23/42* (2013.01); *H01L 23/552* (2013.01); *H01L 2225/06589* (2013.01)

(58) Field of Classification Search
CPC ......... H01L 23/34; H01L 23/36; H01L 23/42; H01L 23/433; H01L 23/3733; H01L 23/3736; H01L 23/4334; H01L 23/552
See application file for complete search history.

(56) References Cited

U.S. PATENT DOCUMENTS

| 6,111,313 A | 8/2000 | Kutlu | |
|---|---|---|---|
| 7,051,790 B2 * | 5/2006 | Lin | ........................ H01L 23/42 |
| | | | 165/185 |

(Continued)

FOREIGN PATENT DOCUMENTS

CN 102881667 A 1/2013

OTHER PUBLICATIONS

Brunschwiler, et al., "Embedded power insert enabling dual-side cooling of microprocessors," 2015 IEEE 65th Electronic Components and Technology Conference (ECTC), 2015.

*Primary Examiner* — David A Zarneke
(74) *Attorney, Agent, or Firm* — ZIP Group PLLC

(57) ABSTRACT

An integrated circuit (IC) chip carrier includes an IC chip electrically connected to an IC chip carrier by a plurality of chip-carrier contacts, a cover thermally connected the IC chip upper surface, and an in-plane thermal conductance (ITC) layer upon the IC chip carrier between the IC chip carrier and the IC chip. The ITC layer includes an extension tab connected to a vertical side surface of the cover. Heat is transferred vertically from the IC chip to the cover. Heat is also transferred vertically from the IC chip to the ITC layer. Heat is also transferred within the ITC layer through the ITC layer basal plane(s). The ITC layer basal plane(s) are positioned horizontally where the ITC layer is between the IC chip and the IC chip carrier. The ITC layer basal planes are positioned vertically where the extension tab contacts the vertical side surface of the cover.

20 Claims, 7 Drawing Sheets

(56) References Cited

U.S. PATENT DOCUMENTS

| | | | |
|---|---|---|---|
| 7,479,695 B2* | 1/2009 | Bachman | H01L 21/563 257/713 |
| 7,892,883 B2* | 2/2011 | Kostiew | H01L 21/50 257/E21.499 |
| 8,502,373 B2 | 8/2013 | Kaskoun et al. | |
| 8,564,092 B2* | 10/2013 | Burgyan | H01L 23/057 257/531 |
| 8,569,869 B2* | 10/2013 | Park | H01L 23/552 257/508 |
| 8,587,111 B2 | 11/2013 | Schuetz | |
| 9,129,929 B2* | 9/2015 | Lundberg | H01L 23/34 |
| 10,141,182 B1* | 11/2018 | Molla | H01L 21/02109 |
| 10,153,250 B2* | 12/2018 | Oggioni | H01L 21/4871 |
| 2008/0230893 A1* | 9/2008 | Too | H01L 23/04 257/704 |
| 2008/0298024 A1* | 12/2008 | Takashima | H01L 23/3732 361/718 |
| 2011/0096507 A1 | 4/2011 | Deram | |
| 2011/0189500 A1 | 8/2011 | Majumdar et al. | |
| 2012/0299173 A1 | 11/2012 | Mohammed et al. | |
| 2016/0043017 A1 | 2/2016 | Jones et al. | |
| 2016/0150631 A1* | 5/2016 | Matsumoto | H05K 1/0204 361/720 |
| 2016/0174416 A1 | 6/2016 | Sinha et al. | |
| 2017/0062394 A1 | 3/2017 | Lin et al. | |
| 2017/0309576 A1* | 10/2017 | Kawabata | H01L 21/32051 |
| 2018/0108618 A1* | 4/2018 | Yamamoto | C23C 14/0036 |
| 2018/0197821 A1* | 7/2018 | Shin | H01L 23/552 |
| 2018/0277490 A1* | 9/2018 | Yoon | H01L 23/552 |
| 2019/0206839 A1* | 7/2019 | Balakrishnan | H01L 23/36 |
| 2019/0230781 A1* | 7/2019 | Onodera | H01L 23/00 |

* cited by examiner

US 10,566,313 B1

INTEGRATED CIRCUIT CHIP CARRIER WITH IN-PLANE THERMAL CONDUCTANCE LAYER

FIELD OF THE EMBODIMENTS

Embodiments of the present invention generally relate to electronic components, such as an electronic package, that include an integrated circuit (IC) chip carrier that includes an in-plane thermal conductance layer.

DESCRIPTION OF THE RELATED ART

Increasing IC chip performance leads to the associated increased need to dissipate or remove heat from the IC chip. Typically, a vertical heat dissipation path has been used to remove heat from IC chips. In such vertical heat dissipation paths, heat generated by the IC chip is transferred vertically through the IC chip, to a cover above the IC chip, and finally to a heatsink above the cover.

SUMMARY

In a first embodiment, an integrated circuit (IC) chip carrier is presented. The carrier includes an IC chip electrically connected to an IC chip carrier by a plurality of chip-carrier contacts, a cover thermally connected the IC chip upper surface, and an in-plane thermal conductance (ITC) layer upon the IC chip carrier between the IC chip carrier and the IC chip. The ITC layer includes an extension tab connected to a vertical side surface of the cover.

In another embodiment, an electronic device is presented. The device includes an IC chip electrically connected to an IC chip carrier by a plurality of chip-carrier contacts, a cover thermally connected the IC chip upper surface, a heatsink thermally connected to the cover upper surface, and an in-plane thermal conductance (ITC) layer upon the IC chip carrier between the IC chip carrier and the IC chip. The ITC layer includes an extension tab connected to a vertical side surface of the cover.

In another embodiment of the invention, a heat removal method includes transferring heat vertically from an IC chip to an IC chip cover above the IC chip, transferring heat vertically from the IC chip to an in-plane thermal conductance (ITC) layer of an IC chip carrier below the IC chip, and transferring heat within the ITC layer through the ITC layer basal plane(s). The ITC layer basal plane(s) are positioned horizontally where the ITC layer is between the IC chip and the IC chip carrier. The ITC layer basal planes are positioned vertically where the ITC layer contacts a side surface of the IC chip cover.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

An integrated circuit (IC) chip carrier includes an IC chip electrically connected to an IC chip carrier by a plurality of chip-carrier contacts, a cover thermally connected the IC chip upper surface, and an in-plane thermal conductance (ITC) layer upon the IC chip carrier between the IC chip carrier and the IC chip. The ITC layer includes an extension tab connected to a vertical side surface of the cover. Heat is transferred vertically from the IC chip to the cover. Heat is also transferred vertically from the IC chip to the ITC layer. Heat is also transferred within the ITC layer through the ITC layer basal plane(s). The ITC layer basal plane(s) are positioned horizontally where the ITC layer is between the IC chip and the IC chip carrier. The ITC layer basal planes are positioned vertically where the extension tab contacts the vertical side surface of the cover.

Figure 1:
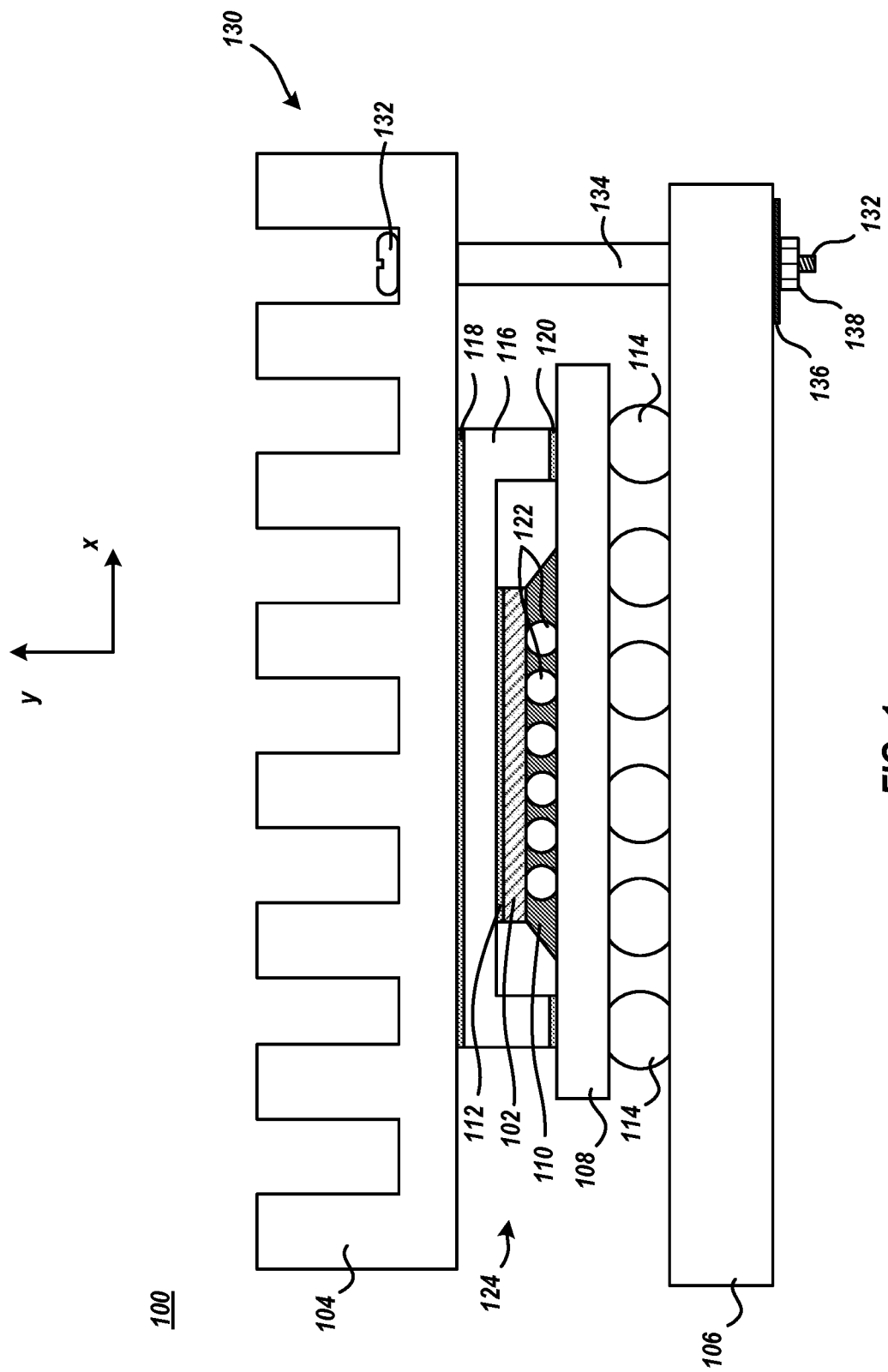
FIG. 1 depicts a cross section of a prior art electronic system.

FIG. 1 depicts a prior art Electronic system 100 that includes an IC carrier package 124. Electronic system 100 may be for example a computer, server, mobile device, tablet, and the like. Package 124 includes chip 102, carrier 108, interconnects 122, underfill 110, thermal interface material 112, lid 116, and adhesive 120. Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108, a lid 116 is attached to carrier 108 with adhesive 120 to cover chip 102. Generally, during operation of electronic system 100, heat is removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic system 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102, a heatsink 104 may be thermally joined to package 124 via thermal interface material 118. Heatsink 104 cools chip 102 by dissipating heat into the surrounding air. As such, during operation of electronic system 100, a substantially vertical thermal path (i.e. most common direction of heat transfer is parallel to the y axis) exists through chip 102 to heatsink 104 through thermal interface material 112, lid 116, and thermal interface material 118, and the like. Heatsink 104 may be connected to motherboard 106 via one or more connection device 130. Connection device 130 may include a threaded fastener 132, standoff 134, backside stiffener 136, and fastener 138. Threaded fastener 132 may extend through heatsink 104, standoff 134, and backside stiffener 136 and provides compressive force between heatsink 104 and backside stiffener 136. The length of standoff 134 may be selected to limit the pressure exerted upon package 124 by heatsink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heatsink 104 upon package 124.

Figure 2:
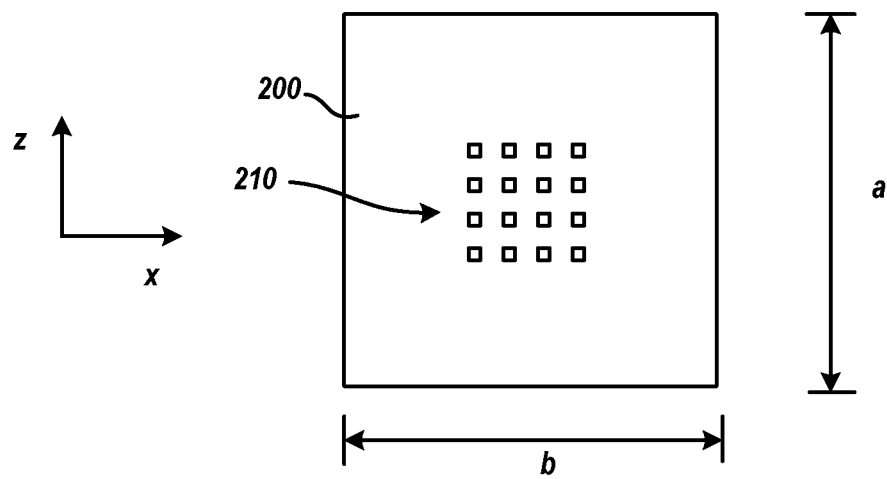
FIG. 2 depicts a normal view of an in-plane thermal conductance (ITC) layer, according to one or more embodiments of the present invention.

FIG. 2 depicts a normal view of in-plane thermal conductance (ITC) layer 200, according to one or more embodiments of the present invention. ITC layer 200 is formed of an anisotropic material that has high thermal conductivity through the basal plane (e.g., the xz plane) and lower thermal conductivity, by one or more orders of magnitude, through the plane orthogonal to the basal plane (e.g., the yx plane). For example, ITC layer 200 may be formed from Crystalline, Graphite, or the like. In an implementation, ITC layer 200 may be formed from Graphite. Graphite has a high in-plane conductivity (~2000 W/mK), due to the strong carbon-to-carbon bonding within each of its basal planes (e.g., zx plane). The parallel Graphite basal planes of Graphite are weakly bonded to each other, however, and the thermal conductivity perpendicular to the basal planes (e.g., in the yx plane) is lower (~10 W/mK).

ITC layer 200 may have a series of cutouts 210 to provide clearance for the conductive contacts of carrier to electrically connect with the conductive contacts of IC chip. For example, each of the series of cutouts 210 may align with a particular contact of the carrier such that the underlying contacts of carrier are exposed so that the contacts may electrically connect with the contacts of the IC chip. The series of cutouts 210 may be arranged in rows and columns to match the contact grid pattern of the underlying carrier.

ITC layer 200 may have zx planar dimensions the same as associated dimensions of the underlying carrier such that vertical surfaces of ITC layer 200 are coplanar with associated vertical surfaces of the underlying carrier. For example, ITC layer 200 may have "a" and "b" zx planar dimensions the same as associated dimensions of the underlying carrier such that the front surface, rear surface, and side surfaces of ITC layer 200 are coplanar with associated surfaces of the underlying carrier. In other implementations, ITC layer 200 may have "a" and "b" zx planar dimensions the same as associated dimensions of IC chip cover there above, such that the front surface, rear surface, and side surfaces of ITC layer 200 are coplanar with associated surfaces of the IC chip cover.

ITC layer 200 may have an exemplary yx planar thickness between 15 µm and 500 µm mm though smaller or thicker thickness are contemplated.

Figure 3:
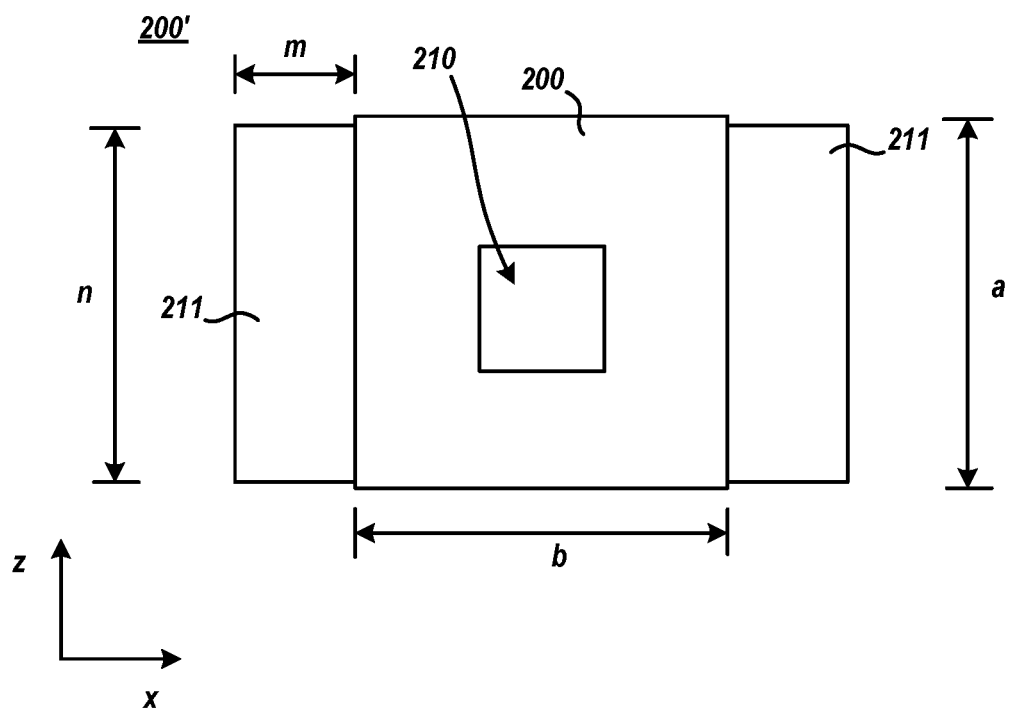
FIG. 3 depicts a normal view of an ITC layer, according to one or more embodiments of the present invention.

FIG. 3 depicts a normal view of an ITC layer 200', according to one or more embodiments of the present invention. ITC layer 200' may have a single cutout 210 within the ITC layer 200 region to provide clearance for the conductive contacts of carrier to electrically connect with the conductive contacts of IC chip. For example, the cutout 210 may align with the perimeter or circumference of the contact grid of the carrier such that the underlying contacts of carrier are exposed so that the contacts may electrically connect with the contacts of the IC chip.

ITC layer 200' may have one or more extension tabs 211 integral with each vertical side surface relative to ITC layer 200 depicted in FIG. 2. The extension tabs 211 extend beyond the perimeter of the IC chip cover there above, such that the extension tabs 211 of ITC layer 200' may thermally contact the IC chip cover and/or heatsink. Extension tab 211 may have a dimension "m"×"n". Dimension "n" may be equal to or less than dimension "a". Dimension "m" may be chosen such that there is a desired length that which extension tab 211 extends beyond the perimeter of the IC chip cover there above so that the extension tabs 211 of ITC layer 200' may contact the cover and/or heatsink above the carrier. Though one extension tab 211 is shown on each side surface of ITC layer 200, more than one extension tabs 211 may be included on each side surface of ITC layer 200.

Figure 4:
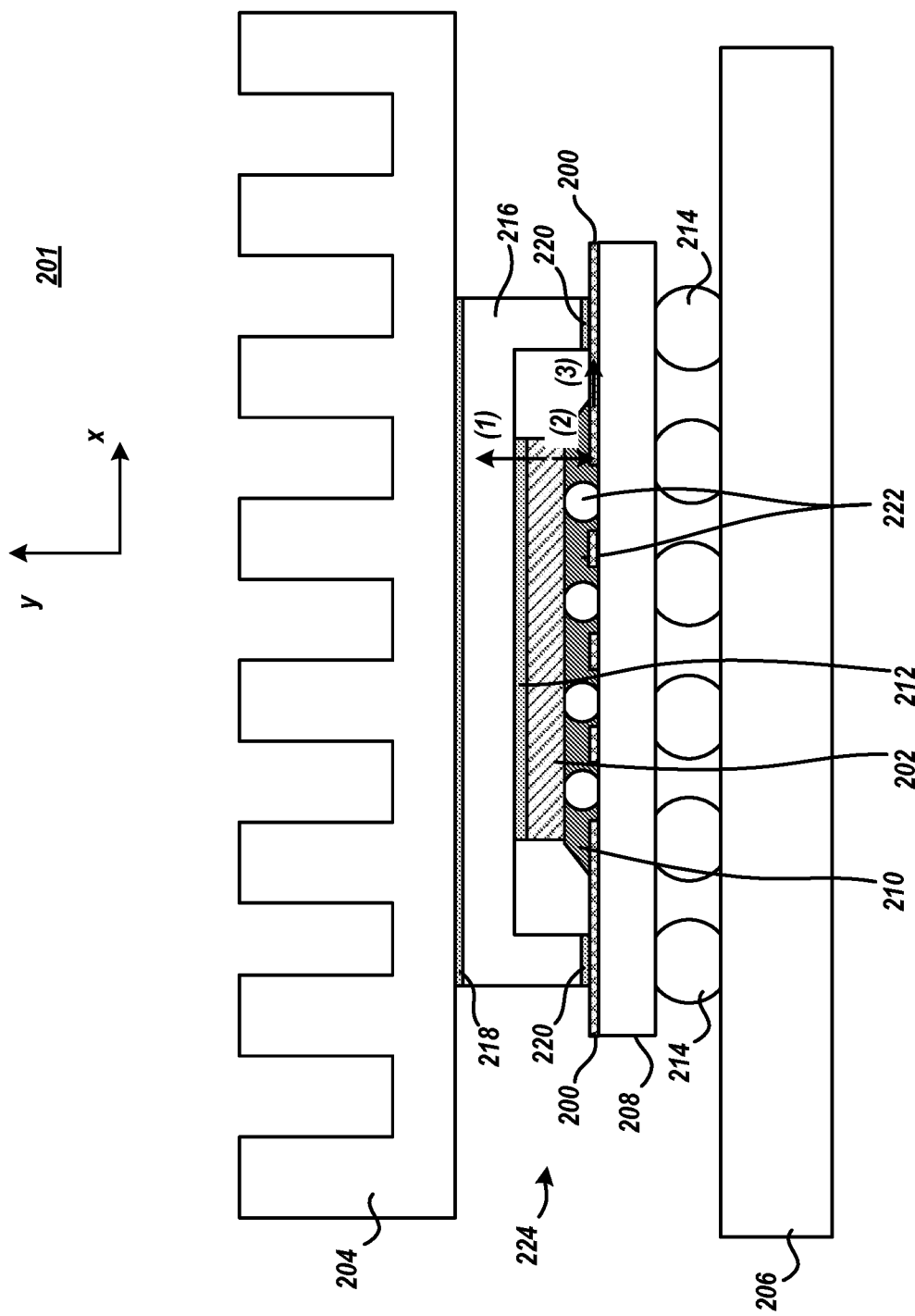
FIG. 4 depicts a cross section of an electronic system that includes an ITC layer, according to one or more embodiments of the present invention.

FIG. 4 depicts a cross section of an electronic system 201 that includes ITC layer 200, according to one or more embodiments of the present invention. Electronic system 201 may be for example a computer, server, mobile device, tablet, and the like. Electronic system 201 includes an IC chip package 224 that includes an IC chip 202, carrier 208, ITC layer 200, interconnects 222, underfill 210, thermal interface material 212, cover 216, and adhesive 220. IC chip 202 may be a semiconductor die, processor, microchip, field programmable gate array, or the like.

Carrier 208 may be an organic carrier or a ceramic carrier and provides mechanical support for IC chip 202 and electrical paths from the upper surface of carrier 208 to the opposing side of carrier 208. Carrier 208 includes ITC layer 200 thereupon. The series of openings 210 are aligned such that the contacts of carrier 208 are exposed and can electrically connect with the contacts of IC chip 202 via interconnects 222.

ITC layer 200 may be formed directly upon carrier 208 via known formation techniques such as deposition, coating, or the like. Alternatively, ITC layer 200 may take the form of a film or sheet and may be applied to the upper surface of carrier 208. In such embodiments, a thermally conductive adhesive may connect the ITC layer 200 and carrier 208. ITC layer 200 may have zx planar dimensions the same as associated dimensions of the underlying carrier 208 such that vertical surfaces of ITC layer 200 are coplanar with associated vertical surfaces of the underlying carrier 208. For example, ITC layer 200 may have "a" and "b" zx planar dimensions the same as associated dimensions of the underlying carrier 208 such that the front surface, rear surface, and side surfaces of ITC layer 200 are coplanar with associated surfaces of the underlying carrier 208.

Interconnects 222 electrically connect IC chip 202 and carrier 208 and may be a wire bond, solder bond, stud, conductive ball, conductive button, and the like. Underfill 210 may be electrically-insulating, may substantially surround interconnects 222, may isolate individual interconnects 222, and may provide mechanical support between IC chip 202 and carrier 208. Underfill 210 may also prevent damage to individual interconnects 222 due to thermal expansion mismatches between IC chip 202 and carrier 208.

When IC chip 202 is seated upon carrier 202, a reflow process may be performed to join interconnects 222 to electrical contacts of both IC chip 202 and carrier 208. After chip 202 is seated to carrier 208, a cover 216 is attached to ITC 200 with adhesive 220 to cover IC chip 202. Adhesive 220 may be a thermally conductive adhesive.

Generally during operation of electronic system 201 heat is removed from IC chip 202. As is traditional, heat is transferred along a path from IC chip 202 substantially vertically into cover 216. As such, cover 216 is both a cover and a conduit for heat transfer. Thermal interface material 212 may thermally join cover 216 and IC chip 202.

In addition, heat is also transferred in a vertical path from the bottom of IC chip 202 into ITC layer 200. Subsequently, heat is transferred substantially horizontally (i.e. most common direction of heat transfer is parallel to the x axis) through the ITC layer 200. Subsequently, the heat within ITC layer 200 is transferred in a substantially vertical path into cover 216.

Package 224 may be connected to a motherboard 206 via interconnects 214. Motherboard 206 may be the main printed circuit board of electronic system 201 and includes electronic components, such as a graphics processing unit, memory, and the like, and provides connectors for other peripherals. Interconnects 214 electrically connect the lower side of carrier 208 to motherboard 206 and may be a wire bond, solder bond, stud, conductive ball, conductive button, and the like. Interconnects 214 may be larger and thus more robust than interconnects 222. When package 224 is seated upon motherboard 206 a second reflow process may be performed to join interconnects 214 to electrical contacts of both carrier 208 and motherboard 206. Alternately, a mechanical pressurized interconnect via an intervening socket may be established.

To assist in the removal of heat from IC chip 202, a heatsink 204 may be thermally joined to package 224 via thermal interface material 218. Heatsink 204 cools IC chip 202 by dissipating heat received from cover 216 into the surrounding air or into an active heat exchanging coolant.

As such, during operation of electronic system 201, a vertical thermal path exists from IC chip 202 to heatsink 204. In addition, a horizontal thermal path exists within the ITC layer 200. This thermal path within the ITC layer 200 may exists underneath the IC chip 202 between the carrier 208 and IC chip 202. As the underside of the IC chip 202 is the active side of many IC chips 202, the underside generates more heat relative to the topside of the IC chip 202. By including the horizontal thermal path within the ITC layer 200 more near the underside of IC chip 202 between the underside of the IC chip 202 and carrier 208, a relatively increased amount of heat from IC chip 202 may be effectively removed therefrom leading to increased IC chip 202 performance.

Figure 5:
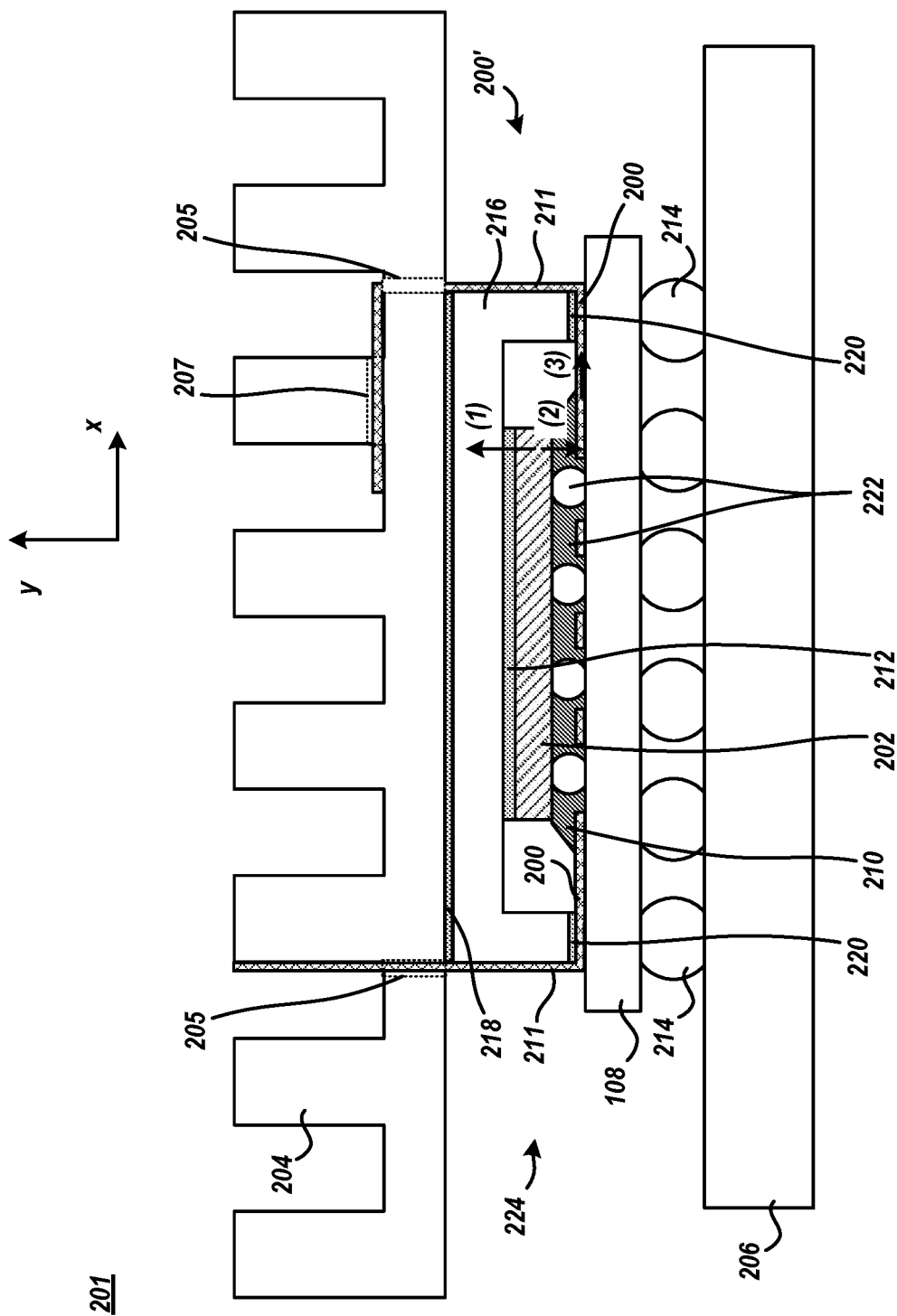
FIG. 5 depicts a cross section of an electronic system that includes an ITC layer, according to one or more embodiments of the present invention.

FIG. 5 depicts a cross section of an electronic system 201 that includes ITC layer 200', according to one or more embodiments of the present invention. Electronic system 201 includes an IC chip package 224 that includes an IC chip 202, carrier 208, ITC layer 200', interconnects 222, underfill 210, thermal interface material 212, cover 216, and adhesive 220.

Carrier 208 includes ITC layer 200' thereupon. The series of openings 210 may be aligned such that the contacts of carrier 208 are exposed and can electrically connect with the contacts of IC chip 202 via interconnects 222. Alternatively, a single opening 210 may be aligned circumferentially around the perimeter of the contact grid of carrier 208 such that the contacts are exposed and can electrically connect with the contacts of IC chip 202 via interconnects 222.

ITC layer 200' may be formed directly upon carrier 208 via known formation techniques such as deposition, coating, or the like with extension tabs 211 extending from the carrier 208. Alternatively, ITC layer 200' may take the form of a film or sheet and may be applied to the upper surface of carrier 208. In such embodiments, a thermally conductive adhesive may connect the ITC layer 200' and carrier 208. ITC layer 200' may have zx planar dimensions the same as associated dimensions of the cover 216 there above such that the extension tabs 211 of ITC layer 200' may be folded toward and contact the vertical surfaces of the cover there above. For example, ITC layer 200' may have "a" and "b" zx planar dimensions the same as associated dimensions of the cover 216 there above such that the extension tabs 211 of ITC layer 200 may be folded toward and thermally connect with the sidewall surfaces of the cover 216 there above.

When IC chip 202 is seated upon carrier 202, a reflow process may be performed to join interconnects 222 to electrical contacts of both IC chip 202 and carrier 208. After chip 202 is seated to carrier 208, a cover 216 may be attached to ITC 200' with adhesive 220 to cover IC chip 202. Adhesive 220 may be a thermally conductive adhesive.

The one or more extension tabs 211 may be folded or otherwise moved toward the cover 216. A thermally conductive adhesive may be applied upon the vertical perimeter surface portions associated with the extension tabs 211 such that the extension tabs thermally connect with the vertical perimeter surface of cover 216.

To assist in the removal of heat from IC chip 202, a heatsink 204 may be thermally joined to package 224 via thermal interface material 218. Heatsink 204 cools IC chip 202 by dissipating heat received from at least cover 216 into the surrounding air or into an active heat exchanging coolant.

In one implementation, the upper surface of the cover 216 may be coplanar with an upper surface of the vertical orientated extension tabs 211 thermally connected with the perimeter vertical surfaces of the cover 216. In another implementation, an extension tab 211 may traverse through a clearance 205 of the heatsink 204 base and may be thermally connected to the heatsink 204 base and/or a heatsink 204 fin, as is exemplary shown on the left side of cover 216 of FIG. 5. In another implementation, an extension tab 211 may traverse through a clearance 205 of the heatsink 204 base and a clearance 207 of one or more heatsink 204 fins and may be thermally connected to the heatsink 204 base and/or a heatsink 204 fin, as is exemplary shown on the right side of cover 216 of FIG. 5. A thermally conductive adhesive may be applied upon the portions of heatsink 204 associated with which the extension tabs 211 traverse, such that the extension tabs thermally connect with these portions of heatsink 204.

Generally during operation of electronic system 201 heat is removed from IC chip 202. As is traditional, heat is transferred along a path from IC chip 202 substantially vertically into cover 216. As such, cover 216 is both a cover and a conduit for heat transfer. Thermal interface material 212 may thermally join cover 216 and IC chip 202.

In addition, heat is also transferred in a vertical path from the bottom of IC chip 202 into ITC layer 200. Subsequently, heat is transferred substantially horizontally (i.e. most common direction of heat transfer is parallel to the x axis) through the ITC layer 200 portion of ITC layer 200'. Subsequently, the heat is transferred in a substantially vertical path within the extension tabs 211 of ITC layer 200. Such heat may ultimately be transferred into cover 216 and/or heatsink 204.

As such, during operation of electronic system 201, a vertical thermal path exists from IC chip 202 to heatsink 204. In addition, a horizontal thermal path exists within the ITC layer 200 region of ITC layer 200' and a vertical thermal path exists within the extension tabs 211 of ITC layer 200. This thermal path within the ITC layer 200 region of layer 200' may exist underneath the IC chip 202 between the carrier 208 and IC chip 202. As the underside of the IC chip 202 is the active side of many IC chips 202, the underside generates more heat relative to the topside of the IC chip 202. By including the horizontal thermal path within the ITC layer 200 region of layer 200' more near the underside of IC chip 202 between the underside of the IC chip 202 and carrier 208 and by including the vertical thermal path within the extension tab 211 of layer 200', a relatively increased amount of heat from IC chip 202 may be effectively removed therefrom leading to increased IC chip 202 performance.

Figure 6:
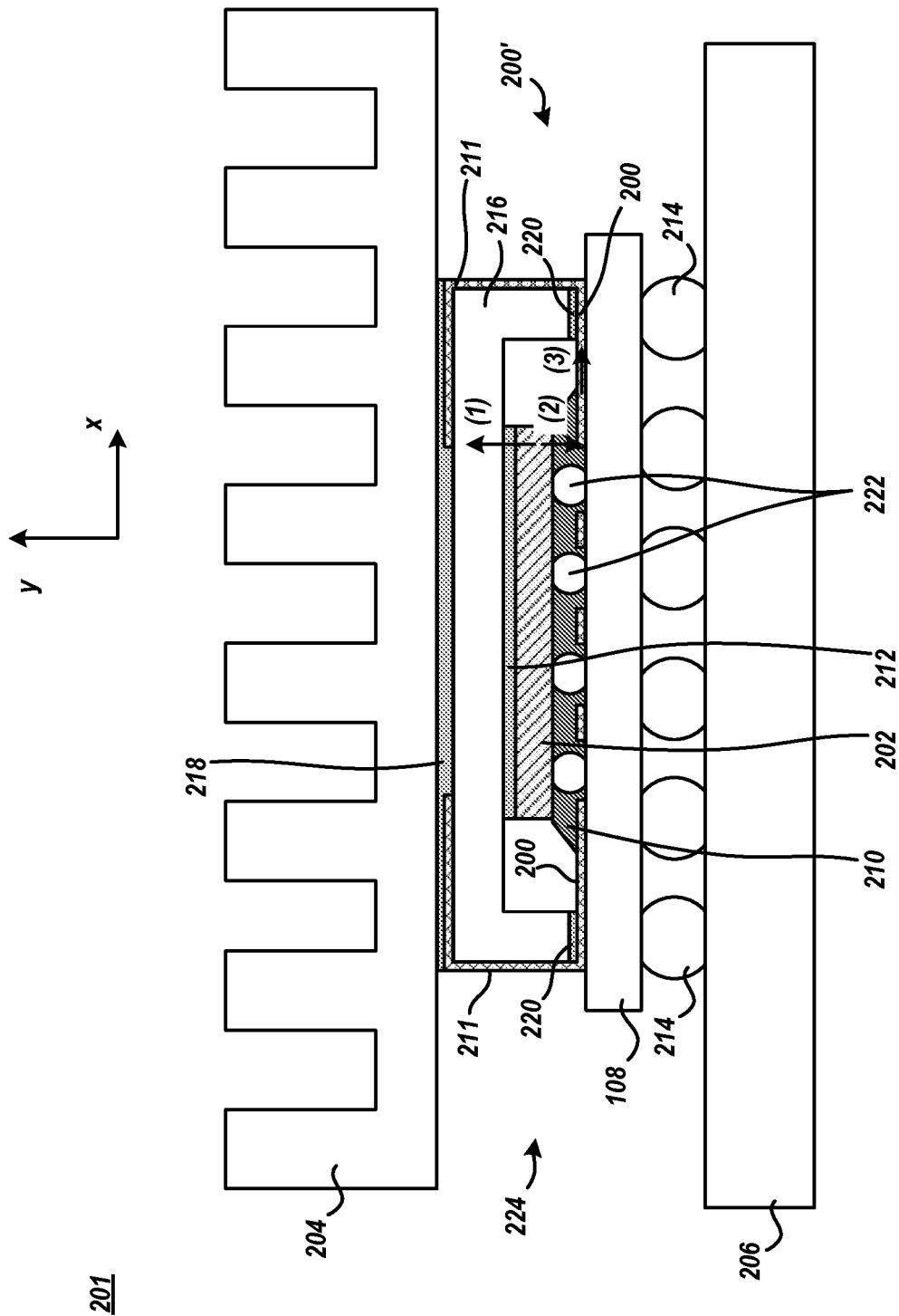
FIG. 6 depicts a cross section of an electronic system that includes an ITC layer, according to one or more embodiments of the present invention.

FIG. 6 depicts a cross section of an electronic system 201 that includes ITC layer 200', according to one or more embodiments of the present invention. Electronic system 201 includes an IC chip package 224 that includes an IC chip 202, carrier 208, ITC layer 200', interconnects 222, underfill 210, thermal interface material 212, cover 216, and adhesive 220.

The one or more extension tabs 211 may be folded or otherwise moved toward the cover 216 to thermally connect with the vertical perimeter surface(s) of cover 216 and may be again moved toward the upper surface of cover 216 to thermally connect with the upper surface of cover 216. A thermally conductive adhesive may be applied upon the vertical perimeter surface portions and upper surface portions of cover 216 associated with the extension tabs 211 such that the extension tabs thermally connect with the vertical perimeter surface(s) and upper surface of cover 216.

To assist in the removal of heat from IC chip 202, a heatsink 204 may be thermally joined to package 224 via thermal interface material 218. Heatsink 204 cools IC chip 202 by dissipating heat received from at least cover 216 into the surrounding air or into an active heat exchanging coolant. Thermal interface material 218 may be applied upon the extension tab 211 portions that are upon the upper surface of cover 216 and upon the upper surface of cover 216.

Generally during operation of electronic system 201 heat is removed from IC chip 202. As is traditional, heat is transferred along a path from IC chip 202 substantially vertically into cover 216. As such, cover 216 is both a cover and a conduit for heat transfer. Thermal interface material 212 may thermally join cover 216 and IC chip 202.

In addition, heat is also transferred in a vertical path from the bottom of IC chip 202 into ITC layer 200. Subsequently, heat is transferred substantially horizontally (i.e. most common direction of heat transfer is parallel to the x axis) through the ITC layer 200 portion of ITC layer 200'. Subsequently, the heat within ITC layer 200' is transferred in a substantially vertical path within the extension tabs 211 of ITC layer 200. Subsequently, the heat is within ITC layer 200 transferred in a substantially horizontal path within the extension tabs 211 of ITC layer 200 along the upper surface of cover 216. Such heat may ultimately be transferred into cover 216 and/or heatsink 204.

As such, during operation of electronic system 201, a vertical thermal path exists from IC chip 202 to heatsink 204. In addition, a horizontal thermal path exists within the ITC layer 200 region of ITC layer 200', a vertical thermal path exists within the extension tabs 211 of ITC layer 200 along the vertical perimeter surface of cover 216, and a horizontal thermal path exists within the extension tabs 211 of ITC layer 200 along the upper surface of cover 216. This thermal path within the ITC layer 200 region of layer 200' may exist underneath the IC chip 202 between the carrier 208 and IC chip 202. As the underside of the IC chip 202 is the active side of many IC chips 202, the underside generates more heat relative to the topside of the IC chip 202. By including the horizontal thermal path within the ITC layer 200 region of layer 200' more near the underside of IC chip 202 between the underside of the IC chip 202 and carrier 208, by including the vertical thermal path within the extension tab 211 of layer 200' along the vertical perimeter surface of cover 216, and by including the horizontal thermal path along the upper surface of cover 216, a relatively increased amount of heat from IC chip 202 may be effectively removed therefrom leading to increased IC chip 202 performance.

Figure 7:
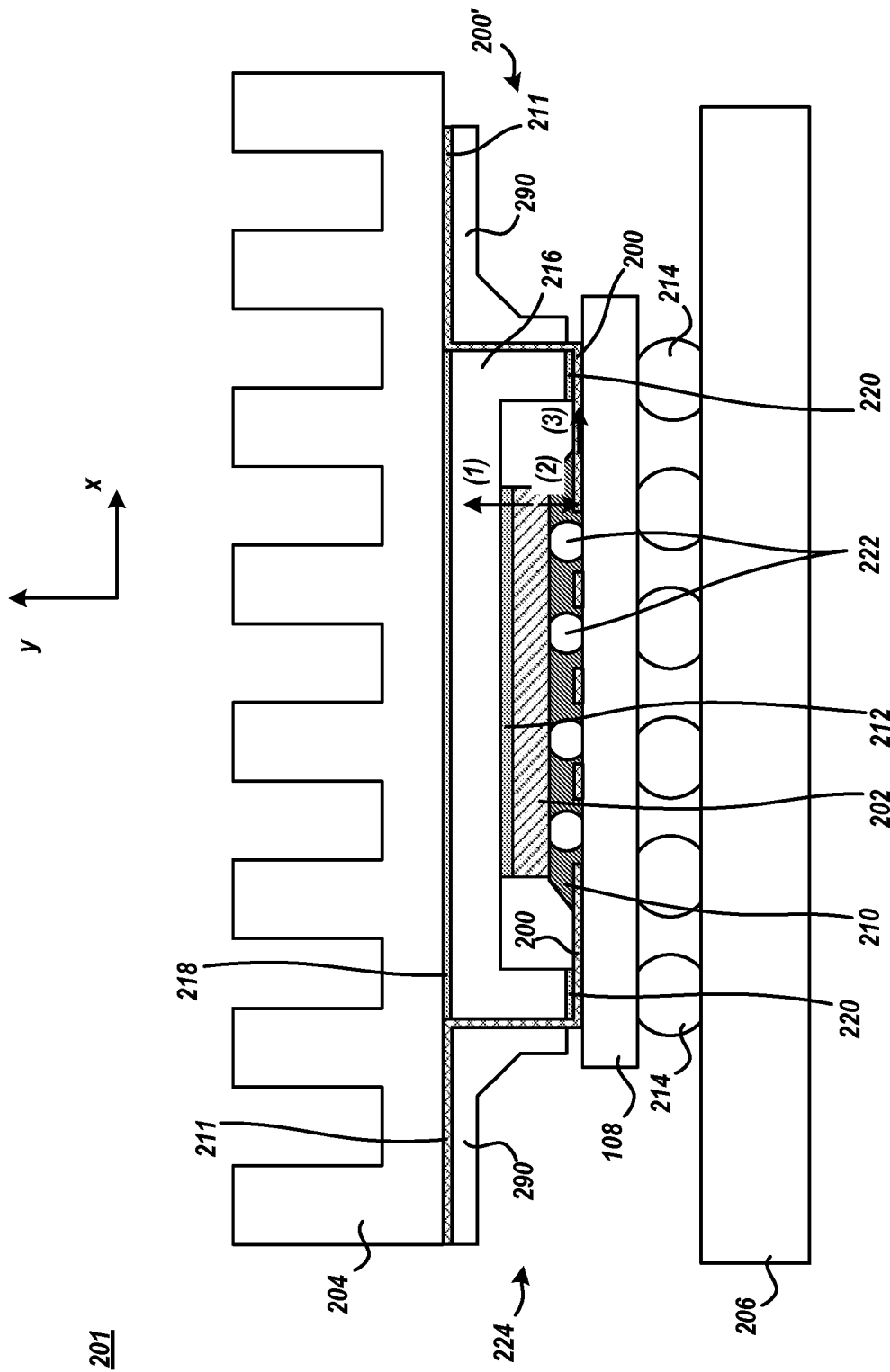
FIG. 7 depicts a cross section of an electronic system that includes an ITC layer, according to one or more embodiments of the present invention.

FIG. 7 depicts a cross section of an electronic system 201 that includes ITC layer 200', according to one or more embodiments of the present invention. Electronic system 201 includes an IC chip package 224 that includes an IC chip 202, carrier 208, ITC layer 200', interconnects 222, underfill 210, thermal interface material 212, cover 216, and adhesive 220. Electronic system 201 also includes a retainer 290.

To assist in the removal of heat from IC chip 202, a heatsink 204 may be thermally joined to package 224 via thermal interface material 218. Heatsink 204 cools IC chip 202 by dissipating heat received from at least cover 216 into the surrounding air or into an active heat exchanging coolant. Thermal interface material 218 may be applied upon the upper surface of cover 216 and the heatsink 204 may be connected thereto.

The one or more extension tabs 211 may be folded or otherwise moved toward the cover 216 to thermally connect with the vertical perimeter surface(s) of cover 216 and may be moved toward the under surface of heatsink 204 to thermally connect with the underside of heatsink 204. Retainer 290 may include one or more rigid forms that retain the extension tabs 211 in contact with at least the vertical perimeter surfaces of cover 216. Retainer 290 may also retain the extension tabs 211 to be in contact the underside of heatsink 204. Retainer 290 may be applied to at least the cover 216 prior to or subsequent to the heatsink 204 being thermally connected to the cover 216.

Generally during operation of electronic system 201 heat is removed from IC chip 202. As is traditional, heat is transferred along a path from IC chip 202 substantially vertically into cover 216. As such, cover 216 is both a cover and a conduit for heat transfer. Thermal interface material 212 may thermally join cover 216 and IC chip 202.

In addition, heat is also transferred in a vertical path from the bottom of IC chip 202 into ITC layer 200. Subsequently, heat is transferred substantially horizontally (i.e. most common direction of heat transfer is parallel to the x axis) through the ITC layer 200 portion of ITC layer 200'. Subsequently, the heat within ITC layer 200' is transferred in a substantially vertical path within the extension tabs 211 of ITC layer 200. Subsequently, the heat within ITC layer 200 transferred in a substantially horizontal path within the extension tabs 211 of ITC layer 200 along the underside of heatsink 204. Such heat may ultimately be transferred into cover 216 and/or heatsink 204.

As such, during operation of electronic system 201, a vertical thermal path exists from IC chip 202 to heatsink 204. In addition, a horizontal thermal path exists within the ITC layer 200 region of ITC layer 200', a vertical thermal path exists within the extension tabs 211 of ITC layer 200 along the vertical perimeter surface of cover 216, and a horizontal thermal path exists within the extension tabs 211 of ITC layer 200 along the underside of heatsink 204. This thermal path within the ITC layer 200 region of layer 200' may exist underneath the IC chip 202 between the carrier 208 and IC chip 202. As the underside of the IC chip 202 is the active side of many IC chips 202, the underside generates more heat relative to the topside of the IC chip 202. By including the horizontal thermal path within the ITC layer 200 region of layer 200' more near the underside of IC chip 202 between the underside of the IC chip 202 and carrier 208, by including the vertical thermal path within the extension tab 211 of layer 200' along the vertical perimeter surface of cover 216, and by including the horizontal thermal path along the underside of heatsink 204, a relatively increased amount of heat from IC chip 202 may be effectively removed therefrom leading to increased IC chip 202 performance.

Figure 8:
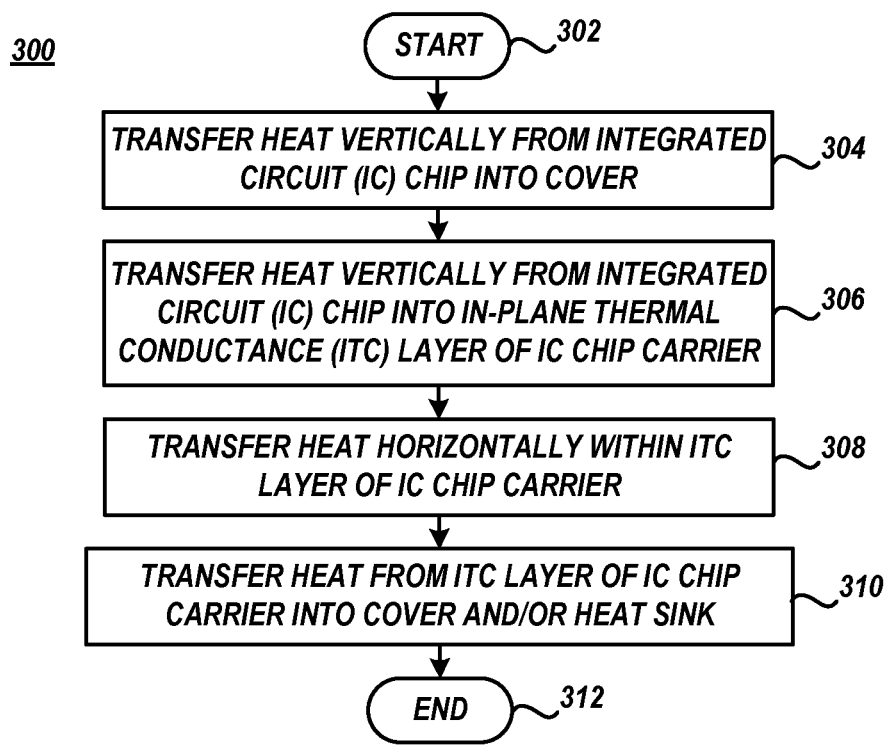
FIG. 8 depicts a heat removal method to transfer heat from an IC chip with at least an ITC layer, according to one or more embodiments of the present invention.

FIG. 8 depicts a heat removal method 300 to transfer heat from an IC chip with at least an ITC layer, according to one or more embodiments of the present invention. Method 400 may be utilized to transfer heat from IC chip 202 with at least ITC layer 200 and/or ITC layer 200'. Method 300 begins at block 302 and continues with transferring heat from the IC chip 202 in a first substantially vertical path from the IC chip 202 into cover 216 there above (block 304). For example, heat generated from powering IC chip 202 is transferred along a first substantially vertical path (i.e. most common direction of heat transfer is parallel to the y axis from IC chip to cover 216 there above) from IC chip 202 into cover 216 as is denoted by path (1) in FIG. 4, in FIG. 5, in FIG. 6, and in FIG. 7.

Method 400 may continue with transferring heat from the IC chip 202 in a second substantially vertical path from the IC chip 202 into an ITC layer there below (block 306). The second substantially vertical path is opposite relative to the first substantially vertical path. For example, heat generated from powering IC chip 202 is transferred along a second substantially vertical path (i.e. most common direction of heat transfer is parallel to the y axis from IC chip to ITC layer there below) from IC chip 202 into ITC layer 200 as is denoted by path (2) in FIG. 4, in FIG. 5, in FIG. 6, and in FIG. 7.

Method 400 may continue with transferring heat within the ITC layer in a substantially horizontal path (block 308). The substantially horizontal path may be substantially perpendicular to the first and second substantially vertical paths (i.e. most common direction of heat transfer is parallel to the x axis within the ITC layer). For example, heat within ITC layer 200 is transferred along the planes in which ITC layer 200 has its high in-plane conductivity (i.e. within the xz plane) as is denoted by path (3) in FIG. 4, in FIG. 5, in FIG. 6, and in FIG. 7.

Method 400 may continue with transferring heat from within the ITC layer to at least cover 216 (block 310). Heat from within the ITC layer may be further transferred into heatsink 204. For example, heat from within ITC layer 200 or from within extension tabs 211 may be transferred into cover 216. Likewise, heat from within extension tabs 211 of ITC layer 200' may be transferred into heatsink 204. In embodiments, the ITC layer basal plane(s) may be arranged or positioned horizontally when the ITC layer is between the IC chip and the IC chip carrier. when the ITC layer 200' extension tabs 211 are folded or positioned upon the vertical sidewall of cover 216, the ITC layer basal planes may be positioned vertically. Method 300 ends at block 312.

Though one processor 202 is shown in IC chip package 224, IC chip package 224 may include multiple processors 202 as is known in the art. In such implementations, ITC layer 200 and/or ITC layer 200' may include multiple modified to allow for such multiple associated cutouts such that each processor 202 may electrically connect with carrier 208.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or upper surface of the carrier 208, regardless of the actual spatial orientation of the carrier 208. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An integrated circuit (IC) chip carrier comprising:
    an IC chip electrically connected to an IC chip carrier by a plurality of chip-carrier contacts;
    a cover thermally connected the IC chip upper surface; and
    an in-plane thermal conductance (ITC) layer upon the IC chip carrier between the IC chip carrier and the IC chip, the ITC layer comprising an extension tab connected to a vertical side surface of the cover.

2. The carrier of claim 1, wherein the ITC layer comprises a plurality of openings therethrough, each of the plurality of openings aligned with one of the plurality of chip-carrier contacts.

3. The carrier of claim 1, wherein the ITC layer comprises an opening therethrough, the opening aligned around the circumference of the plurality of chip-carrier contacts.

4. The carrier of claim 1, wherein the ITC layer is an anisotropic material that has first thermal conductivity through its basal plane and a second thermal conductivity through its plane orthogonal to the basal plane, wherein the second thermal conductivity is lower than the first thermal conductivity.

5. The carrier of claim 1, wherein the ITC layer is a Graphite ITC layer.

6. The carrier of claim 1, wherein the extension tab is further connected to the cover upper surface.

7. The carrier of claim 1, wherein ITC layer transfers heat from the IC chip horizontally between the IC chip and the carrier.

8. An electronic device comprising:
    an IC chip electrically connected to an IC chip carrier by a plurality of chip-carrier contacts;
    a cover thermally connected the IC chip upper surface;
    a heatsink thermally connected to the cover upper surface; and
    an in-plane thermal conductance (ITC) layer upon the IC chip carrier between the IC chip carrier and the IC chip, the ITC layer comprising an extension tab connected to a vertical side surface of the cover.

9. The electronic device of claim 8, wherein the ITC layer comprises a plurality of openings therethrough, each of the plurality of openings aligned with one of the plurality of chip-carrier contacts.

10. The electronic device of claim 8, wherein the ITC layer comprises an opening therethrough, the opening aligned around the circumference of the plurality of chip-carrier contacts.

11. The electronic device of claim 8, wherein the ITC layer is an anisotropic material that has first thermal conductivity through its basal plane and a second thermal conductivity through its plane orthogonal to the basal plane, wherein the second thermal conductivity is lower than the first thermal conductivity.

12. The electronic device of claim 8, wherein the ITC layer is a Graphite ITC layer.

13. The electronic device of claim 8, wherein the extension tab is further connected to the heatsink.

14. The electronic device of claim 8, wherein ITC layer transfers heat from the IC chip horizontally between the IC chip and the carrier.

15. A heat removal method comprising:
    transferring heat vertically from an IC chip to an IC chip cover above the IC chip;
    transferring heat vertically from the IC chip to an in-plane thermal conductance (ITC) layer of an IC chip carrier below the IC chip; and
    transferring heat within the ITC layer through the ITC layer basal plane(s), wherein the ITC layer basal plane(s) are positioned horizontally where the ITC layer is between the IC chip and the IC chip carrier and wherein the ITC layer basal planes are positioned vertically where the ITC layer contacts a side surface of the IC chip cover.

16. The method of claim 15, wherein the ITC layer comprises a plurality of openings therethrough, each of the plurality of openings aligned with one of a plurality of chip-carrier contacts that electrically connect the IC chip to the IC chip carrier.

17. The method of claim 15, wherein the ITC layer comprises an opening therethrough, the opening aligned around a circumference of a plurality of chip-carrier contacts that electrically connect the IC chip to the IC chip carrier.

18. The method of claim 15, wherein the ITC layer is an anisotropic material that has first thermal conductivity through its basal plane and a second thermal conductivity through its plane orthogonal to the basal plane, wherein the second thermal conductivity is lower than the first thermal conductivity.

19. The method of claim 15, wherein the ITC layer is a Graphite ITC layer.

20. The method of claim 15, wherein the ITC layer basal planes are positioned horizontally where the ITC layer contacts an upper surface of the IC chip cover.

* * * * *